(12) United States Patent
Zhao et al.

(10) Patent No.: US 9,768,066 B2
(45) Date of Patent: Sep. 19, 2017

(54) SEMICONDUCTOR DEVICE AND METHOD OF FORMING CONDUCTIVE VIAS BY DIRECT VIA REVEAL WITH ORGANIC PASSIVATION

(71) Applicant: STATS ChipPAC, Ltd., Singapore (SG)

(72) Inventors: Xing Zhao, Singapore (SG); Duk Ju Na, Singapore (SG); Lai Yee Chia, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 61 days.

(21) Appl. No.: 14/316,225

(22) Filed: Jun. 26, 2014

(65) Prior Publication Data
US 2015/0380310 A1    Dec. 31, 2015

(51) Int. Cl.
*H01L 21/768* (2006.01)
*H01L 23/48* (2006.01)
(Continued)

(52) U.S. Cl.
CPC ...... *H01L 21/76898* (2013.01); *H01L 23/481* (2013.01); *H01L 24/10* (2013.01); *H01L 25/0657* (2013.01); *H01L 22/14* (2013.01); *H01L 2224/16145* (2013.01); *H01L 2225/06513* (2013.01); *H01L 2225/06541* (2013.01)

(58) Field of Classification Search
CPC ....... H01L 2224/73204; H01L 2224/97; H01L 21/76898; H01L 2224/0401; H01L 23/481; H01L 25/0657; H01L 2225/06541; H01L 2224/13025; H01L 2225/06513; H01L 2224/13009; H01L 24/97; H01L 2924/14; H01L 2224/81; H01L 2224/02372; H01L 2224/16146; H01L 2224/82; H01L 21/76877; H01L 21/76843

See application file for complete search history.

(56) References Cited

U.S. PATENT DOCUMENTS 7,683,458 B2 * 3/2010 Akram ................ H01L 21/6835
257/621
8,198,174 B2 * 6/2012 Hsu ..................... H01L 21/76898
257/E21.585

(Continued)

*Primary Examiner* — Bac Au
(74) *Attorney, Agent, or Firm* — Robert D. Atkins; Patent Law Group;Atkins and Associates, P.C.

(57) ABSTRACT

A semiconductor device has a semiconductor wafer and a conductive via formed partially through the semiconductor wafer. A portion of the semiconductor wafer and conductive via is removed by a chemical mechanical polishing process. The semiconductor wafer and conductive via are coplanar at first and second surfaces. A first insulating layer and a second insulating layer are formed over the conductive via and semiconductor wafer. The first insulating layer includes an inorganic material and the second insulating layer includes an organic material. An opening in the first and second insulating layers is formed over the conductive via while a second portion of the conductive via remains covered by the first and second insulating layers. A conductive layer is formed over the conductive via and first insulating layer. An interconnect structure is formed over the conductive layer. The semiconductor wafer is singulated into individual semiconductor die.

22 Claims, 14 Drawing Sheets

(51) Int. Cl.
*H01L 25/065* (2006.01)
*H01L 23/00* (2006.01)
*H01L 21/66* (2006.01)

(56) References Cited

U.S. PATENT DOCUMENTS

| | | | |
|---|---|---|---|
| 8,263,497 B2 | 9/2012 | Andry | |
| 8,466,062 B2* | 6/2013 | Lu | H01L 21/76898 257/E21.577 |
| 8,501,587 B2* | 8/2013 | Chen | H01L 21/76898 257/698 |
| 8,536,678 B2* | 9/2013 | Nowak | H01L 21/76898 257/532 |
| 8,558,389 B2* | 10/2013 | Na | H01L 21/568 257/774 |
| 8,659,162 B2 | 2/2014 | Suthiwongsunthorn et al. | |
| 8,736,028 B2* | 5/2014 | Tuttle | H01L 21/76898 257/621 |
| 8,742,591 B2* | 6/2014 | Choi | H01L 21/76898 257/622 |
| 8,790,996 B2* | 7/2014 | Monadgemi | H01L 21/76898 257/686 |
| 8,927,426 B2* | 1/2015 | Lee | H01L 21/76898 257/621 |
| 8,941,216 B2* | 1/2015 | Lee | H01L 21/76898 257/621 |
| 9,299,663 B2* | 3/2016 | Wirz | H01L 21/0274 |
| 9,412,662 B2* | 8/2016 | Lin | H01L 21/78 |
| 2008/0054444 A1* | 3/2008 | Tuttle | H01L 21/76898 257/698 |
| 2008/0083558 A1* | 4/2008 | Chujo | H01L 21/486 174/250 |
| 2009/0026614 A1* | 1/2009 | Jung | H01L 21/76898 257/738 |
| 2011/0133333 A1* | 6/2011 | Kwon | H01L 21/76898 257/737 |
| 2012/0126420 A1* | 5/2012 | Chen | H01L 24/05 257/774 |
| 2012/0228780 A1* | 9/2012 | Kim | H01L 23/36 257/774 |
| 2013/0147036 A1 | 6/2013 | Choi et al. | |
| 2013/0187287 A1* | 7/2013 | Park | H01L 21/76898 257/774 |
| 2013/0221493 A1 | 8/2013 | Kim et al. | |
| 2013/0252416 A1 | 9/2013 | Takeda et al. | |
| 2014/0008802 A1 | 1/2014 | Yang et al. | |
| 2014/0048952 A1* | 2/2014 | Lee | H01L 23/5384 257/774 |
| 2014/0057430 A1* | 2/2014 | Lee | H01L 21/76898 438/613 |
| 2014/0141569 A1* | 5/2014 | Jo | H01L 21/50 438/109 |
| 2014/0179103 A1* | 6/2014 | Kang | H01L 21/7684 438/667 |
| 2014/0191414 A1* | 7/2014 | Kim | H01L 21/76898 257/774 |
| 2014/0300002 A1* | 10/2014 | Na | H01L 23/481 257/774 |
| 2015/0123278 A1* | 5/2015 | Park | H01L 21/76898 257/751 |

* cited by examiner

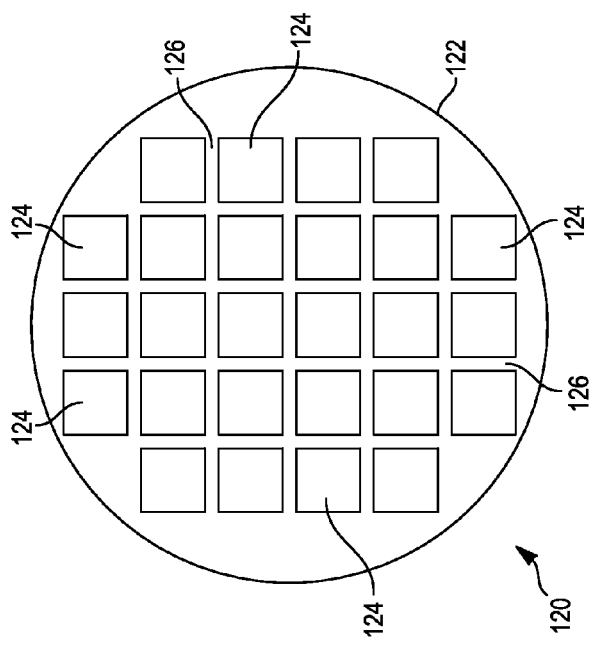
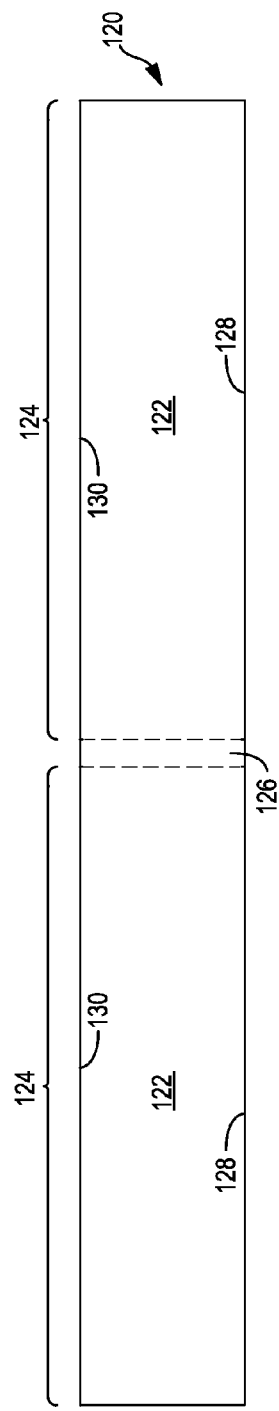
FIG. 2a
FIG. 2b

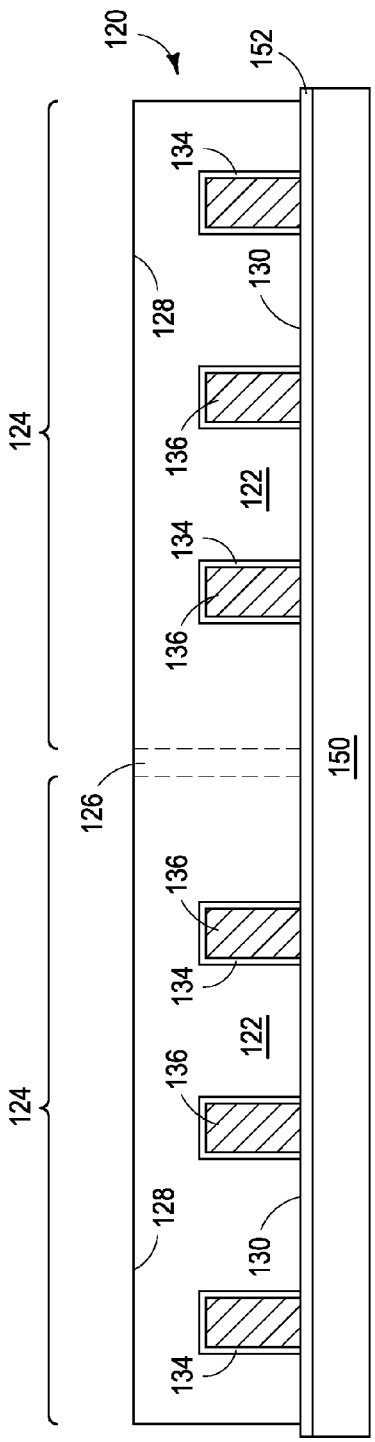
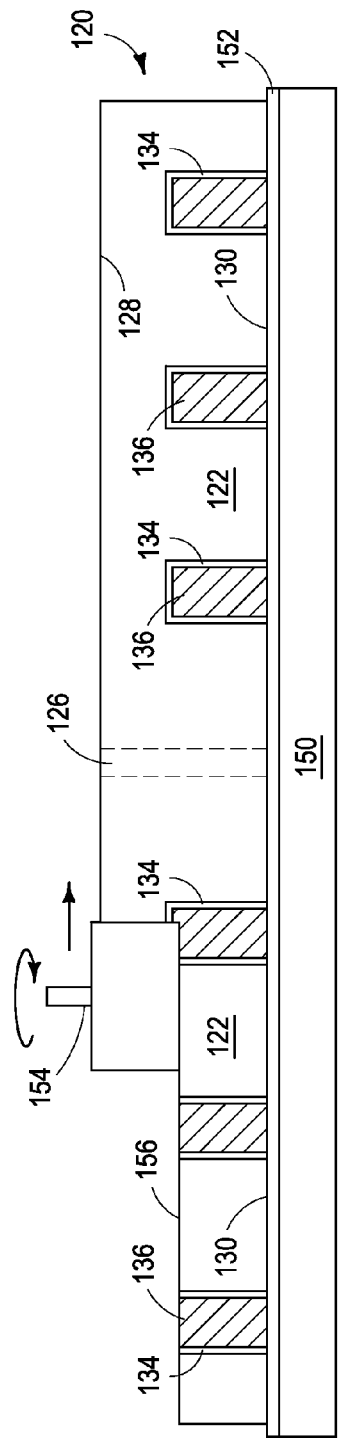

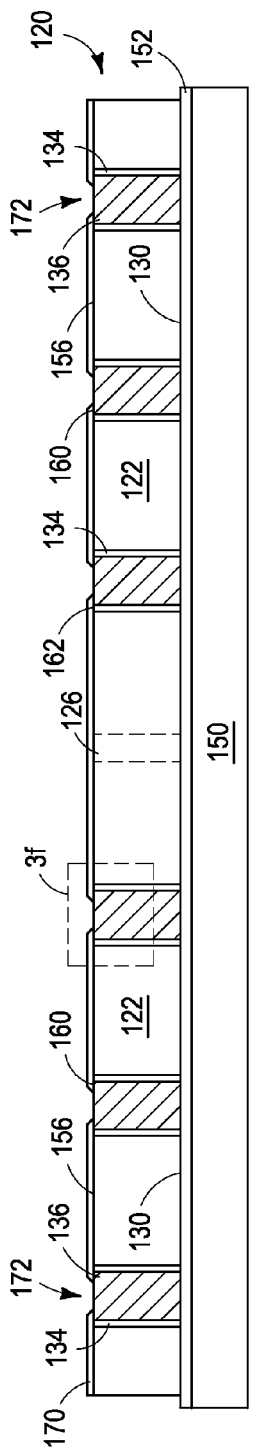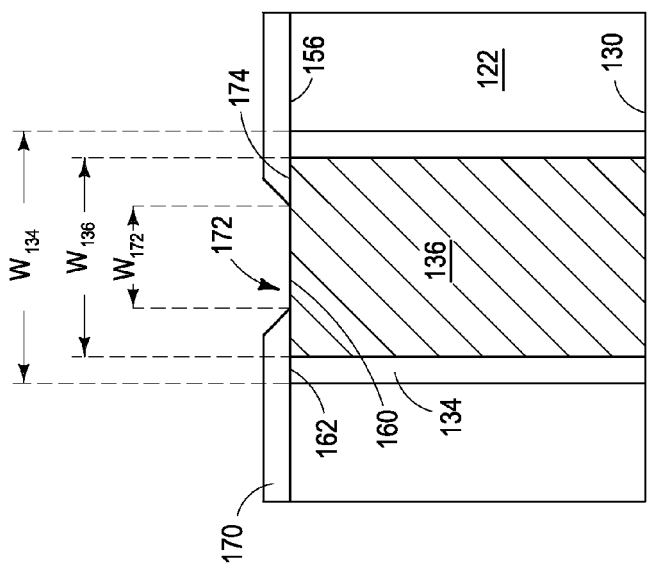
FIG. 3e
FIG. 3f

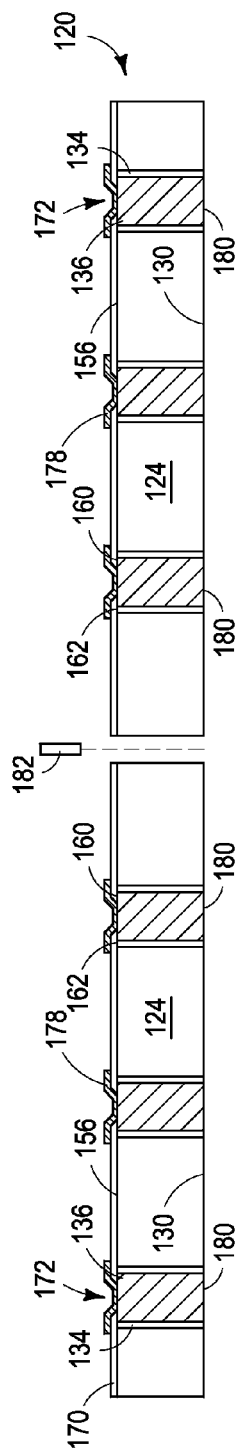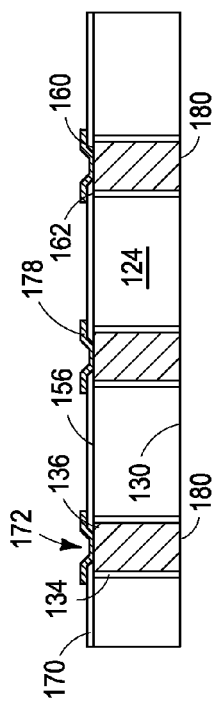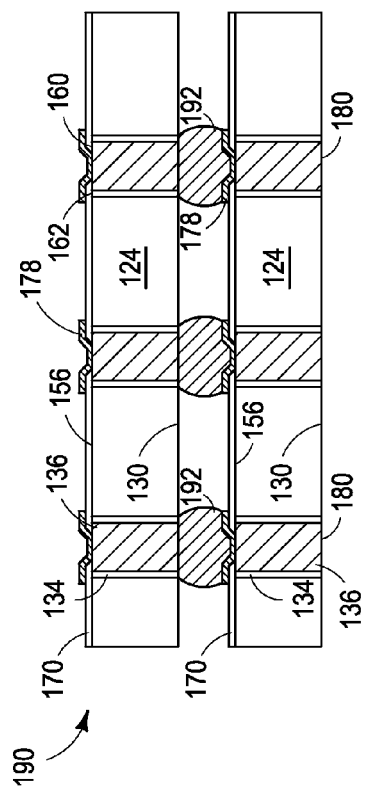
FIG. 3i
FIG. 3j
FIG. 3k

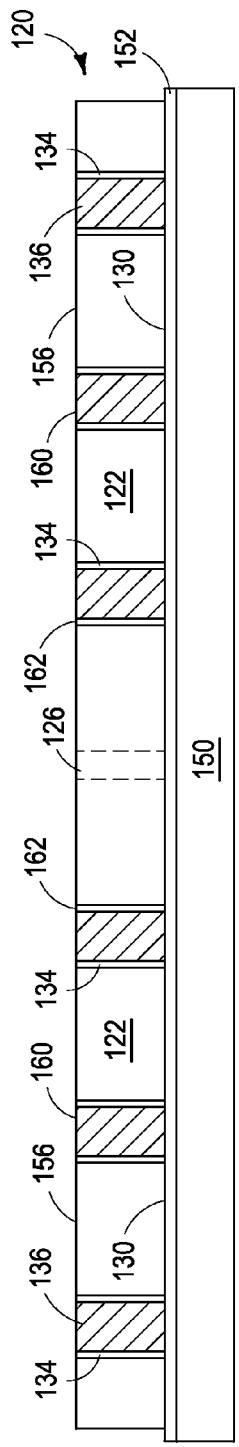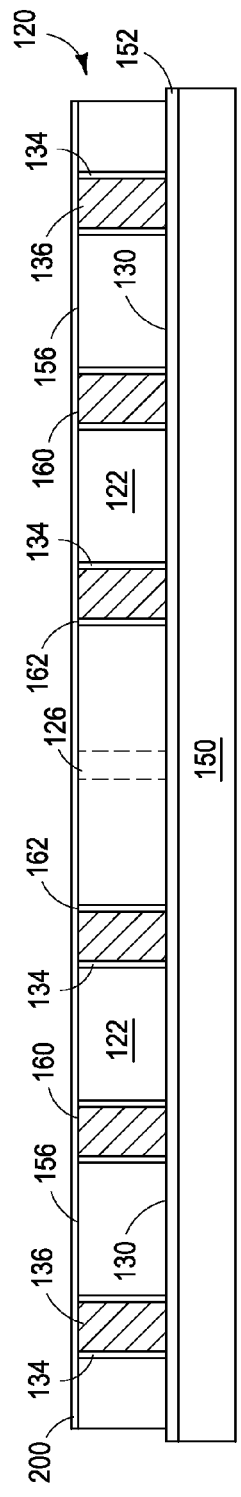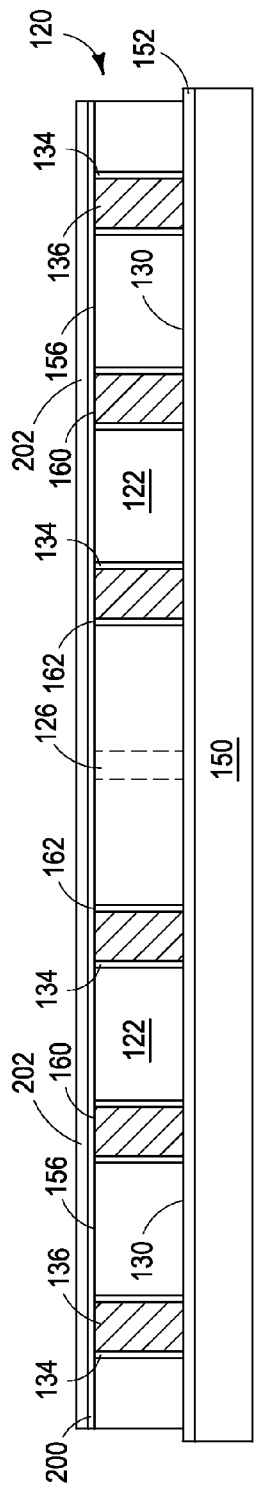

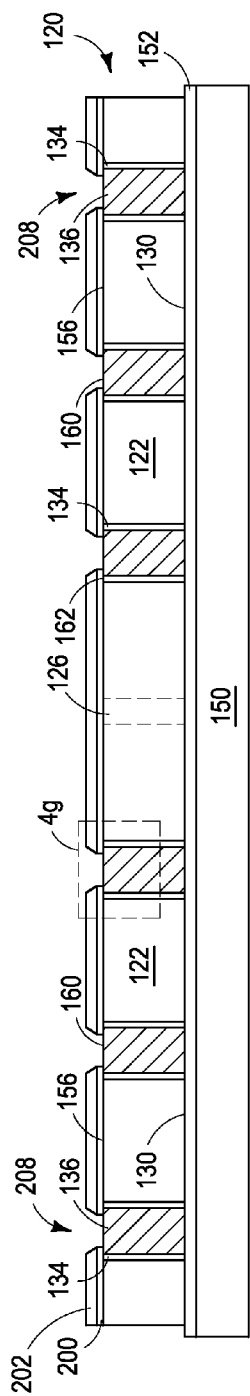
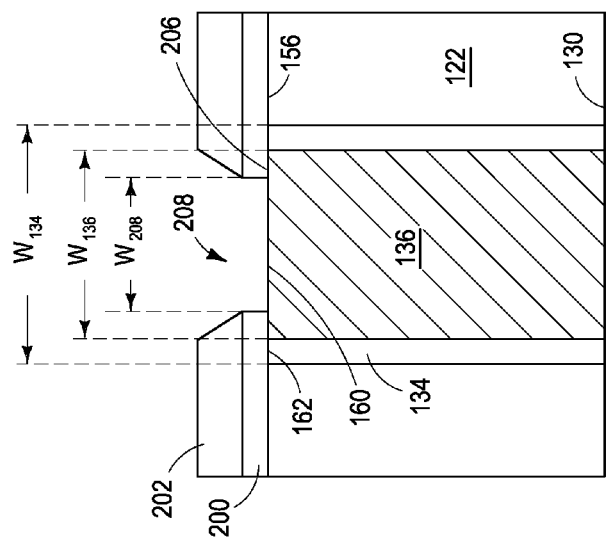
FIG. 4f
FIG. 4g

US 9,768,066 B2

SEMICONDUCTOR DEVICE AND METHOD OF FORMING CONDUCTIVE VIAS BY DIRECT VIA REVEAL WITH ORGANIC PASSIVATION

FIELD OF THE INVENTION

The present invention relates in general to semiconductor devices and, more particularly, to a semiconductor device and method of forming conductive vias using a direct via reveal process and organic passivation.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor wafer may contain conductive through-silicon vias (TSV). TSV provide vertical electrical connection through semiconductor die in three-dimensional (3D) integration of semiconductor packaging. A plurality of vias is formed through the semiconductor wafer. The vias are filled with conductive material to form the conductive TSV. Conductive TSV formed partially through a semiconductor wafer are revealed or exposed by removing a portion of the semiconductor material using a backside via reveal (BVR) process. Current BVR processes involve multiple processing steps including multiple chemical mechanical polishing (CMP) steps, silicon etching, multiple passivation processes, photolithography, and passivation etching.

CMP is an expensive manufacturing process, and the multiple CMP steps involved in current BVR processes increase the cost of manufacturing the semiconductor devices. The CMP process is inadequate for processing wafers having different thicknesses and different TSV depths. Alternatively, a portion of the back surface of the semiconductor wafer is removed by a photolithographic etching process with a 1× stepper to expose a portion of the side surface of the conductive TSV. The 1× stepper typically cannot provide sufficient overlay margin for the photolithographic and etching process. Current BVR processes are limited in capability to process different wafer thicknesses and different TSV depths. Thus, current BVR processes are not economical for mass production.

SUMMARY OF THE INVENTION

A need exists for a cost effective method of forming and revealing conductive vias using fewer processing steps. Accordingly, in one embodiment, the present invention is a method of making a semiconductor device comprising the steps of providing a semiconductor wafer, forming a conductive via partially through the semiconductor wafer, removing a portion of the semiconductor wafer and conductive via, forming a first insulating layer over the conductive via and semiconductor wafer, and removing a first portion of the first insulating layer from over the conductive via.

In another embodiment, the present invention is a method of making a semiconductor device comprising the steps of providing a semiconductor wafer, forming a conductive via through the semiconductor wafer, removing a first portion of the semiconductor wafer and conductive via, and forming a first insulating layer over the conductive via and semiconductor wafer.

In another embodiment, the present invention is a semiconductor device comprising a semiconductor wafer. A conductive via is formed through the semiconductor wafer and is coplanar with the semiconductor wafer. A first insulating layer is formed over the semiconductor wafer and the conductive via.

In another embodiment, the present invention is a semiconductor device comprising a semiconductor wafer. A conductive via is formed through the semiconductor wafer. A first insulating layer is formed over the semiconductor wafer and conductive via.

BRIEF DESCRIPTION OF THE DRAWINGS

FIGS. 2a-2f illustrate a semiconductor wafer with a plurality of semiconductor die separated by a saw street;

FIGS. 3a-3k illustrate a method of forming a semiconductor wafer including conductive vias by direct via reveal with organic passivation; and FIGS. 4a-4l illustrate a method of forming a semiconductor wafer including conductive vias by direct via reveal with organic and inorganic passivation.

DETAILED DESCRIPTION OF THE DRAWINGS

Figure 1:
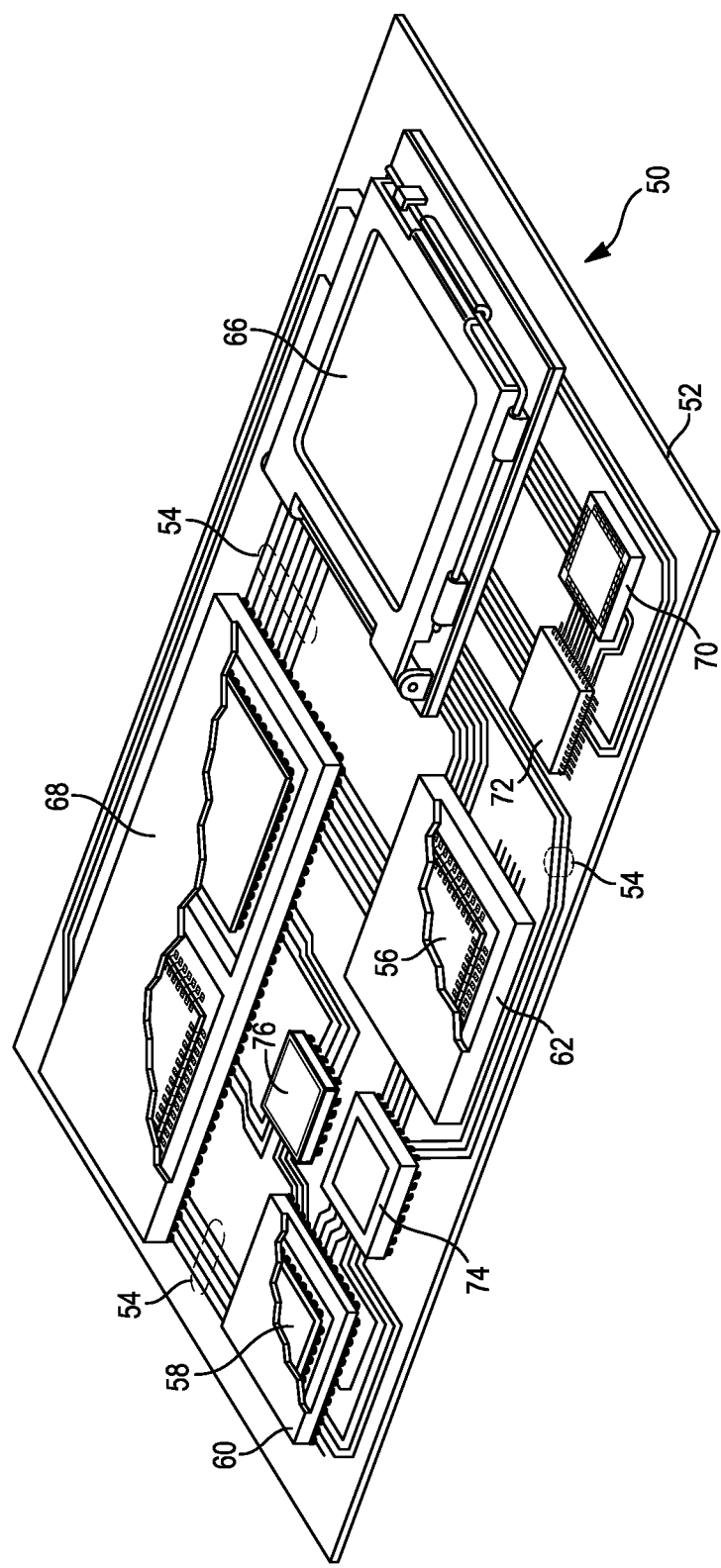
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2C:
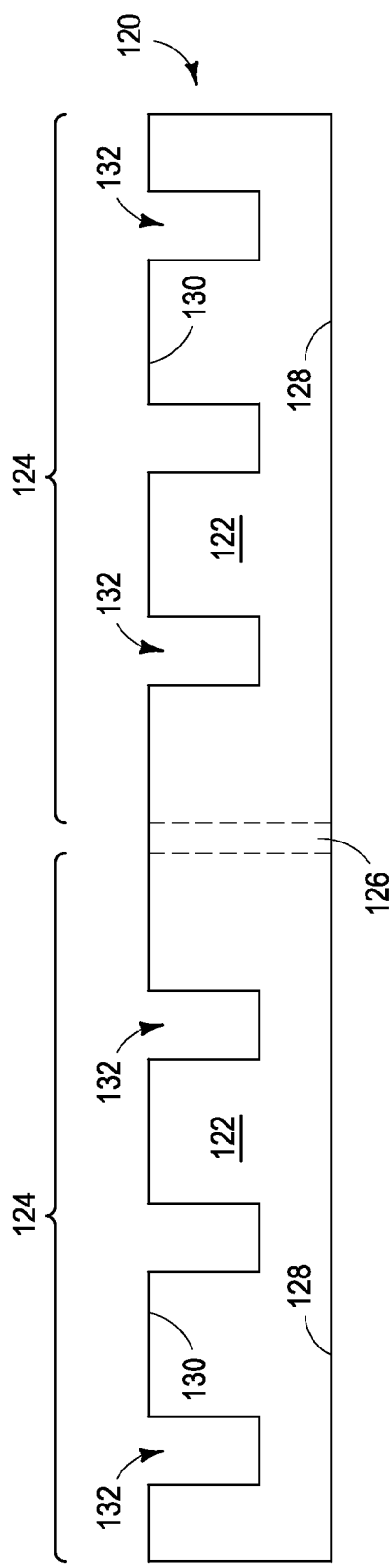

FIGS. 2a-2f illustrate, in relation to FIG. 1, a process of forming conductive vias through a semiconductor wafer. FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm).

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

In FIG. 2c, a plurality of vias or blind vias 132 is formed into active surface 130 and partially but not completely through semiconductor wafer 120 using mechanical drilling, laser drilling, or deep reactive ion etching (DRIE).

Figure 2D:
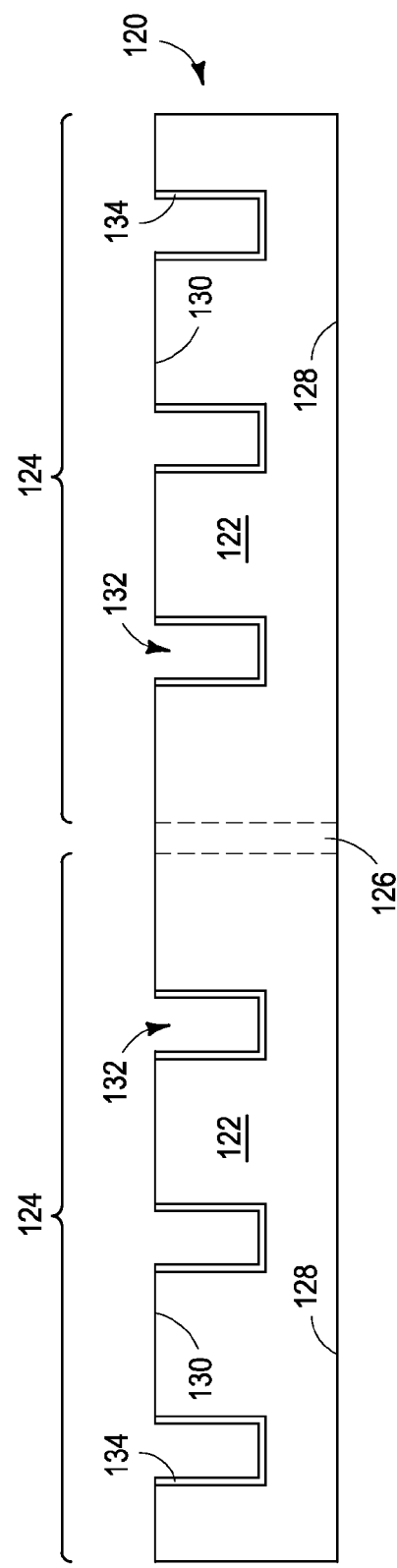

In FIG. 2d, an insulating or dielectric layer 134 is formed within vias 132 over sidewalls of vias 132 using PVD, CVD, printing, spin coating, spray coating, sintering or thermal oxidation. Insulating layer 134 contains one or more layers of silicon dioxide (SiO2), silicon nitride (Si3N4), silicon oxynitride (SiON), tantalum pentoxide (Ta2O5), aluminum oxide (Al2O3), or other suitable dielectric material. In one embodiment, insulating layer 134 includes a liner oxide.

Figure 2E:
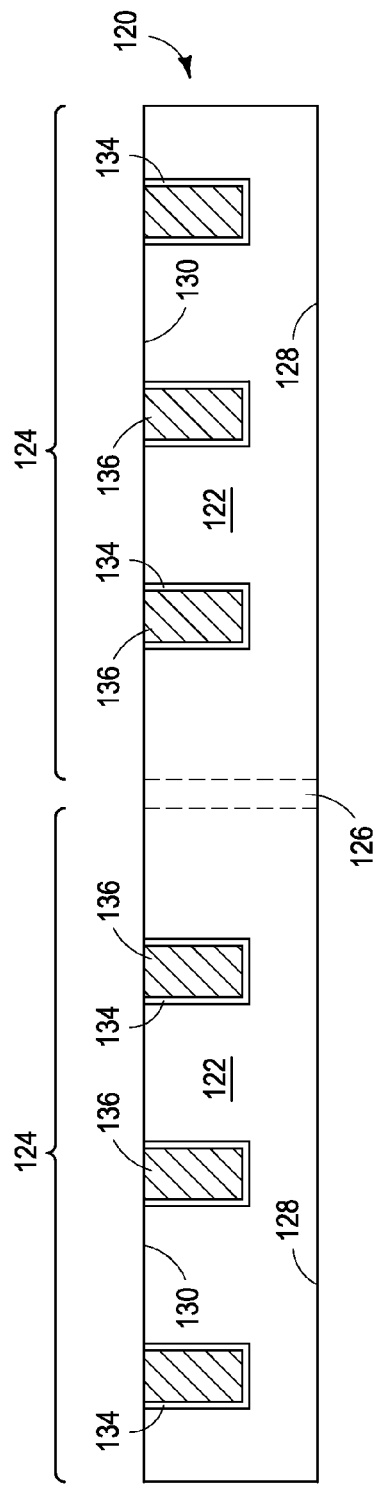

In FIG. 2e, vias 132 are filled with an electrically conductive material to form a plurality of conductive through-silicon-vias (TSV) or conductive vias 136. Conductive vias 136 can be one or more layers of aluminum (Al), copper (Cu), tin (Sn), nickel (Ni), gold (Au), silver (Ag), titanium (Ti), tungsten (W), poly-silicon, or other suitable electrically conductive material using electrolytic plating, electroless plating process, or other suitable metal deposition process. Conductive vias 136 provide z-direction interconnect through semiconductor die 124. Conductive vias 136 are lined with insulating layer 134 and embedded within semiconductor wafer 120. In one embodiment, insulating layer 134 operates as a barrier layer to inhibit diffusion of conductive vias 136, e.g., Cu, into base substrate material 122. Conductive vias 136 are electrically connected to the circuits on active surface 130.

Figure 2F:
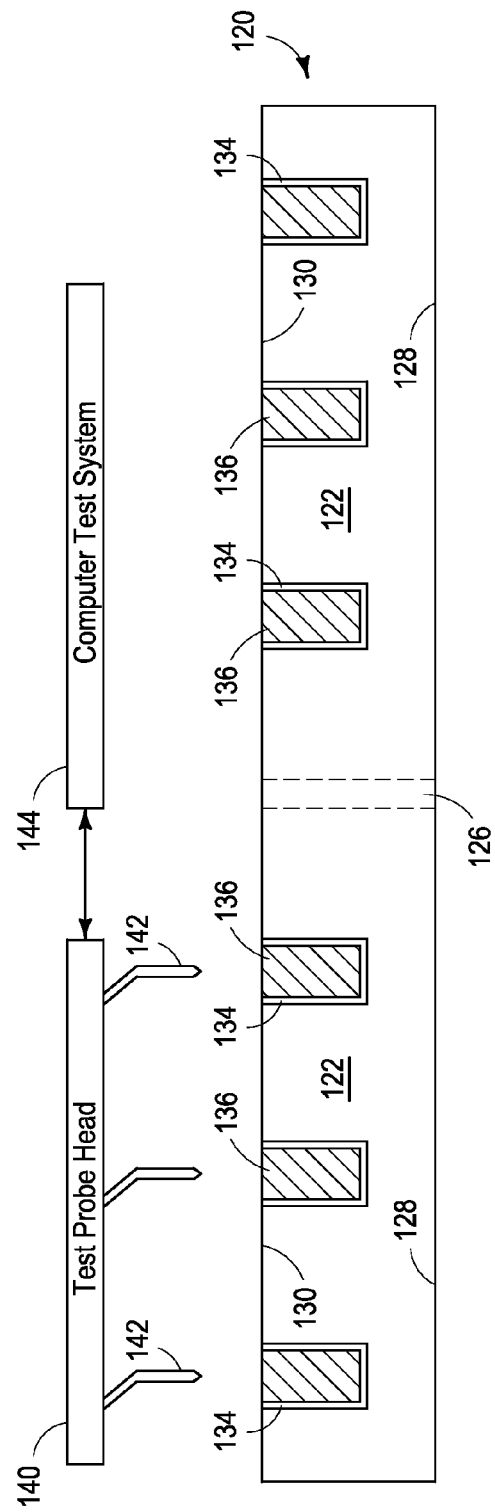

In FIG. 2f, semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters, as shown in FIG. 2c, using a test probe head 140 including a plurality of probes or test leads 142, or other testing device. Probes 142 are used to make electrical contact with nodes or conductive layer 134 on each semiconductor die 124 and provide electrical stimuli to contact pads 132. Semiconductor die 124 responds to the electrical stimuli, which is measured by computer test system 144 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 3C:
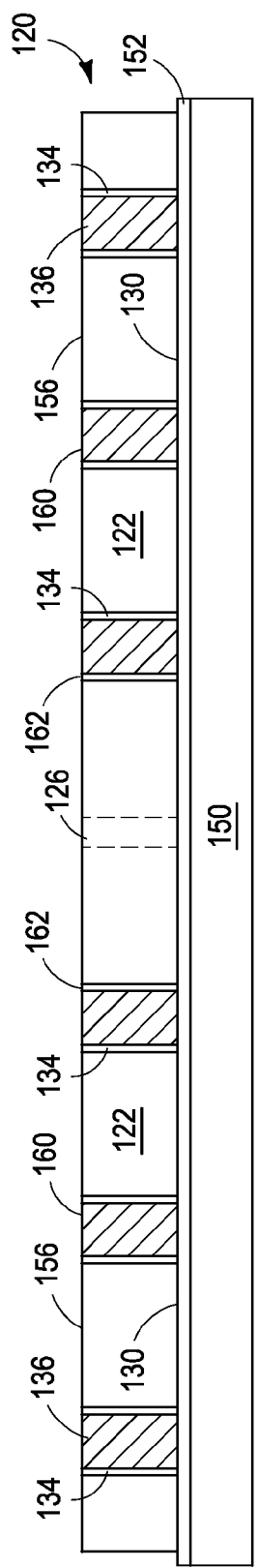

FIGS. 3a-3k, illustrate, in relation to FIGS. 1 and 2a-2f, a process of revealing conductive vias including an organic passivation layer. FIG. 3a shows a cross-sectional view of a portion of a carrier or temporary substrate 150 containing sacrificial base material such as silicon, polymer, beryllium oxide, glass, or other suitable low-cost, rigid material for structural support. An interface layer or double-sided tape 152 is formed over carrier 150 as a temporary adhesive bonding film, etch-stop layer, or thermal release layer. Semiconductor wafer 120 including semiconductor die 124 from FIG. 2f are mounted to interface layer 152 over carrier 150 with active surface 130 oriented toward the carrier. Semiconductor wafer 120 is inverted and positioned over interface layer 152 and carrier 150.

In FIG. 3b, a portion of semiconductor wafer 120 is removed from back surface 128 by CMP, backgrinding with grinder 154, or an etching process to expose conductive vias 136 through a BVR process. In one embodiment, the BVR process is completed using CMP of back surface 128 using chemical slurries in combination with mechanical, physical-contact etching. The CMP process gradually removes base substrate material 122 from back surface 128 to reveal or expose conductive vias 136 without damaging other portions of semiconductor wafer 120, i.e., without over etching or under etching base substrate material 122. The BVR process forms a planar backside surface 156 and reveals conductive vias 136 through base substrate material 122. After the CMP process is complete, back surface 156 of semiconductor wafer 120 is exposed. A thickness of semiconductor wafer 120 is reduced by the CMP process.

FIG. 3c shows semiconductor wafer 120 including planar surface 156. After the CMP process is complete, surface 160 of conductive vias 136 and surface 162 of insulating layer 134 are exposed from base substrate material 122. Surface 156 of base substrate material 122, surface 160 of conductive TSV 136, and surface 162 of insulating layer 134 are coplanar after the CMP process. Conductive vias 136 and semiconductor wafer 120 are coplanar at a first surface, such as surface 156 of the semiconductor wafer 120, and at a second surface, such as active surface 130, opposite the first surface.

Figure 3D:
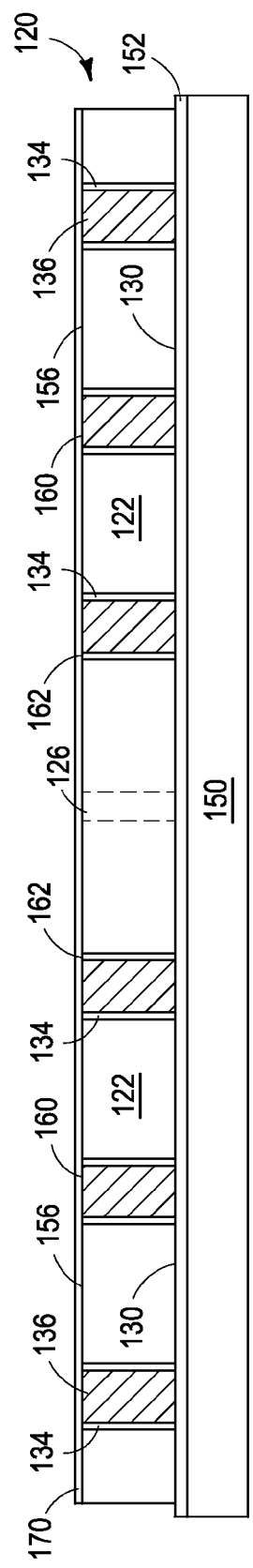

In FIG. 3d, an insulating or passivation layer 170 is formed over surface 156 of semiconductor wafer 120 using PVD, CVD, printing, spin coating, spray coating, sintering or thermal oxidation. Insulating layer 170 contains one or more layers of SiO2, Si3N4, SiON, Ta2O5, Al2O3, hafnium oxide (HfO2), benzocyclobutene (BCB), polyimide (PI), polybenzoxazoles (PBO), or other material having similar insulating and structural properties. In one embodiment, insulating layer 170 includes an organic passivation material or organic insulating material. Insulating layer 170 covers surface 156 of semiconductor wafer 120, surface 160 of conductive vias 136, and surface 162 of insulating layer 134. Because surfaces 156, 160, and 162 are coplanar and form a planar surface over semiconductor wafer 120, insulating layer 170 is formed with a uniform thickness over the planar surface.

In FIG. 3e, a portion of insulating layer 170 is removed by patterning through a photolithography process to form openings 172 and expose conductive vias 136. After the photolithography process, an exposed surface of conductive vias 136 undergoes a cleaning process, such as plasma cleaning or wet cleaning, to remove contamination. Alternatively, openings 172 are formed by an etching process or laser direct ablation (LDA) to remove a portion of insulating layer 170 and expose conductive vias 136. A first portion of insulating layer 170 is removed from over conductive vias 136 while leaving a second portion of insulating layer 170 covering conductive vias 136.

FIG. 3f shows the structure of FIG. 3e in greater detail. Openings 172 in insulating layer 170 are formed to expose a portion of surface 160 of conductive vias 136, while a portion 174 of conductive vias 136 remains covered by insulating layer 170. The sidewalls of openings 172 can have a tapered, straight, or stepped profile. In one embodiment, insulating layer 170 overlies surface 162 of insulating layer 134 and a portion 174 of conductive vias 136. A cross-sectional width $W_{172}$ of openings 172 is less than a width $W_{136}$ of conductive vias 136. Insulating layer 170 covers coplanar surface 156 of base substrate material 122, portion 174 of surface 160 of conductive vias 136, and surface 162 of insulating layer 134. In another embodiment, openings 172 include a cross-sectional width $W_{172}$ greater than a width $W_{136}$ of conductive vias 136 or greater than a width $W_{134}$ of insulating layer 134 together with conductive vias 136.

Figure 3G:
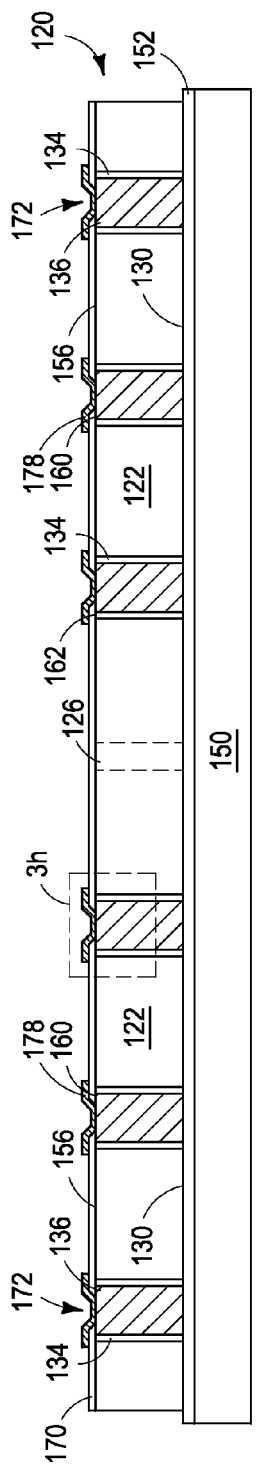

In FIG. 3g, an electrically conductive layer 178 is formed over insulating layer 170 and conductive vias 136 using printing, PVD, CVD, sputtering, evaporation, electrolytic plating, electroless plating, or other suitable metal deposition process. Conductive layer 178 can be one or more layers of Al, Cu, Sn, Ni, Au, Ag, Ti, W, titanium tungsten (TiW), titanium copper (TiCu), titanium tungsten copper (TiWCu), tantalum nitrogen copper (TaNCu), or other suitable material. Conductive layer 178 directly contacts the exposed portion of conductive vias 136 at surface 160. Conductive layer 178 operates as an under bump metallization (UBM) electrically connected to conductive vias 136. Conductive layer 178 can be a multi-metal stack with adhesion layer, barrier layer, and seed or wetting layer. The adhesion layer is formed over conductive vias 136 and can be Ti, Al, TiW, titanium nitride (TiN), or chromium (Cr). The barrier layer is formed over the adhesion layer and can be Ni, Ti, TiW, tantalum nitride (TaN), nickel vanadium (NiV), platinum (Pt), palladium (Pd), chromium copper (CrCu), or other suitable barrier material. The barrier layer inhibits the diffusion of Cu into the active area of the die. The seed layer is formed over the barrier layer and can be Cu, Ni, NiV, Au, or Al. Conductive layer 178 provides a low resistive interconnect to conductive vias 136, as well as a barrier to solder diffusion and seed layer for solder wettability.

Figure 3H:
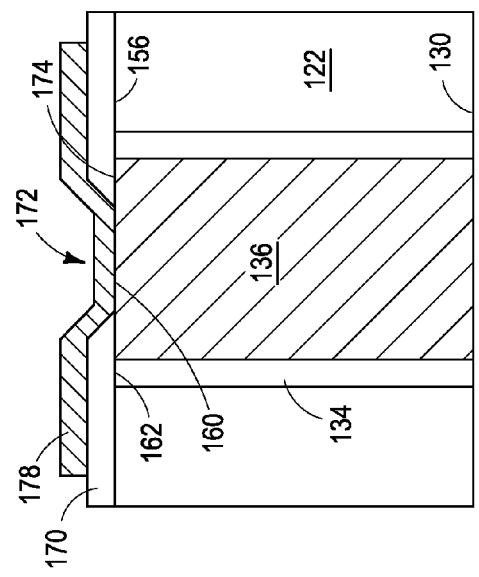

FIG. 3h shows the structure of FIG. 3g in greater detail. Conductive layer 178 is formed over insulating layer 170, within openings 172 in insulating layer 170, and over the sidewalls of openings 172. In one embodiment, conductive layer 178 is formed conformally over the entire surface 156 of semiconductor wafer 120, and portions of conductive layer 178 over insulating layer 170 are subsequently removed by etching or other suitable process.

In FIG. 3i, carrier 150 and interface layer 152 are removed by chemical etching, mechanical peeling, CMP, mechanical grinding, thermal bake, UV light, laser scanning, or wet stripping to expose active surface 130 of semiconductor wafer 120. After carrier 150 and interface layer 152 are removed, active surface 130 of semiconductor die 124 and surface 180 of conductive vias 136 are exposed.

Semiconductor wafer 120 is singulated through saw street 126 using a saw blade or laser cutting tool 182 into individual semiconductor die 124. Semiconductor die 124 is electrically connected to conductive layer 178 through conductive vias 136. The individual semiconductor die 124 can be inspected and electrically tested for identification of KGD post singulation.

FIG. 3j shows semiconductor die 124 after singulation. Semiconductor die 124 includes conductive vias 136 extending completely through semiconductor die 124 extending from active surface 130 to surface 156 opposite active surface 130. Conductive vias 136 are surrounded by insulating layer 134 formed over a sidewall of conductive vias 136. Surface 180 of conductive vias 136 is exposed at active surface 130 of semiconductor die 124. Conductive layer 178 is electrically connected to conductive vias 136. Conductive vias 136 route electrical signals through semiconductor die 124. Conductive vias 136 provide vertical electrical interconnection from active surface 130 of semiconductor die 124 to external devices, for example a PCB. Semiconductor die 124 can be further processed into many types of semiconductor packages, including eWLB, WLCSP, reconstituted or embedded wafer level chip scale packages (eWLCSP), fan-out WLCSP, flipchip packages, 3D packages, package-on-package (PoP), or other semiconductor packages.

The process for revealing conductive vias 136 includes fewer steps than current via reveal processes. In particular, the process of forming and revealing conductive vias 136 is accomplished with fewer CMP, etching, and passivation steps. For example, one CMP step is used during the wafer-thinning step of FIG. 3b, while a second CMP step is eliminated through the process shown in FIGS. 3a-3i. Additionally, the steps of etching semiconductor wafer 120 and forming an inorganic passivation layer over semiconductor wafer 120 are eliminated. Therefore, semiconductor die 124 can be produced more cost-effectively without the expensive processes of silicon etching, inorganic passivation, and additional CMP steps. Elimination of etching, CMP, and passivation steps reduces the cost of manufacturing semiconductor die 124 including conductive vias 136. Additionally, the use of an organic insulating material, rather than an inorganic insulating material, reduces the overall stress on the semiconductor device.

FIG. 3k shows semiconductor package 190 formed by stacking two or more semiconductor die 124. An electrically conductive bump material is deposited over conductive layer 178 or conductive vias 136 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 178 using a suitable attachment or bonding process. In one embodiment, the bump material is reflowed by heating the material above its melting point to form balls or bumps 192. In some applications, bumps 192 are reflowed a second time to improve electrical contact to conductive layer 178 and conductive vias 136. In one embodiment, bumps 192 are formed over a UBM layer. Bumps 192 can also be compression bonded or thermocompression bonded to conductive layer 178 or conductive vias 136. Bumps 192 represent one type of interconnect structure that can be formed over conductive layer 178 or conductive vias 136. The interconnect structure can also use bond wires, conductive paste, stud bump, micro bump, or other electrical interconnect.

The stacked semiconductor die 124 are electrically connected through bumps 192. Additional interconnect structures, similar to bumps 192, are formed over conductive vias 136 and conductive layer 178 to provide electrical interconnect to external devices. The circuits on active surface 130 of a first semiconductor die 124 are electrically connected through conductive vias 136 and bumps 192 to the circuits on active surface 130 of a second semiconductor die 124.

Figure 4D:
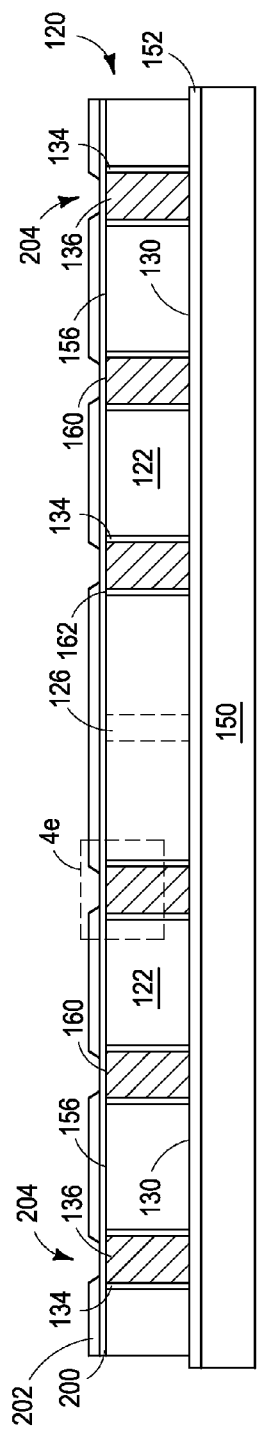

FIGS. 4a-4l illustrate, in relation to FIGS. 1 and 2a-2f, a process of revealing conductive vias including organic and inorganic passivation. Continuing from FIG. 3c, FIG. 4a shows a semiconductor wafer 120 after planarization. Semiconductor wafer 120 includes conductive vias 136 formed through base substrate material 122. Insulating layer 134 is formed around conductive vias 136. Semiconductor wafer 120 including semiconductor die 124 from FIG. 2f are mounted to interface layer 152 over carrier 150 with active surface 130 oriented toward the carrier. Semiconductor wafer 120 is inverted and positioned over interface layer 152 and carrier 150. Semiconductor wafer 120 includes planar surface 156. Surface 160 of conductive vias 136 and surface 162 of insulating layer 134 are exposed from base substrate material 122 by a CMP process. Surface 156 of base substrate material 122, surface 160 of conductive vias 136, and surface 162 of insulating layer 134 are coplanar after the CMP process.

In FIG. 4b, an insulating or passivation layer 200 is formed over semiconductor wafer 120 and conductive vias 136 using PVD, CVD, printing, lamination, spin coating, or spray coating. Insulating layer 200 contains one or more layers of SiO2, Si3N4, SiON, Ta2O5, Al2O3, HfO2, BCB, PI, PBO, solder resist, or other material having similar insulating and structural properties. In one embodiment, insulating layer 200 includes an inorganic insulating material or inorganic passivation material. Insulating layer 200 covers surface 156 of semiconductor wafer 120, surface 160 of conductive vias 136, and surface 162 of insulating layer 134. Because surfaces 156, 160, and 162 are coplanar and form a planar surface over semiconductor wafer 120, insulating layer 200 is formed with a uniform thickness over the planar surface.

In FIG. 4c, an insulating or passivation layer 202 is formed over insulating layer 200 using PVD, CVD, printing, lamination, spin coating, or spray coating. Insulating layer 202 contains one or more layers of SiO2, Si3N4, SiON, Ta2O5, Al2O3, HfO2, BCB, PI, PBO, solder resist, or other material having similar insulating and structural properties. In one embodiment, insulating layer 202 includes an organic insulating material or organic passivation material. Insulating layer 202 is formed having a uniform thickness over insulating layer 200. Insulating layer 202 covers insulating layer 200 and is disposed over surface 156 of semiconductor wafer 120, surface 160 of conductive vias 136, and surface 162 of insulating layer 134.

In FIG. 4d, a portion of insulating layer 202 is removed by patterning through a photolithography process to form openings 204 and expose insulating layer 200. After the photolithography process, a surface of semiconductor wafer 120 and insulating layers 200 and 202 undergoes a cleaning process, such as plasma cleaning or wet cleaning, to remove contamination. Alternatively, openings 204 are formed by an etching process or LDA to remove a portion of insulating layer 202 and expose insulating layer 200. A first portion of insulating layer 202 is removed from over conductive vias 136 while leaving a second portion of insulating layer 202 covering conductive vias 136.

Figure 4E:
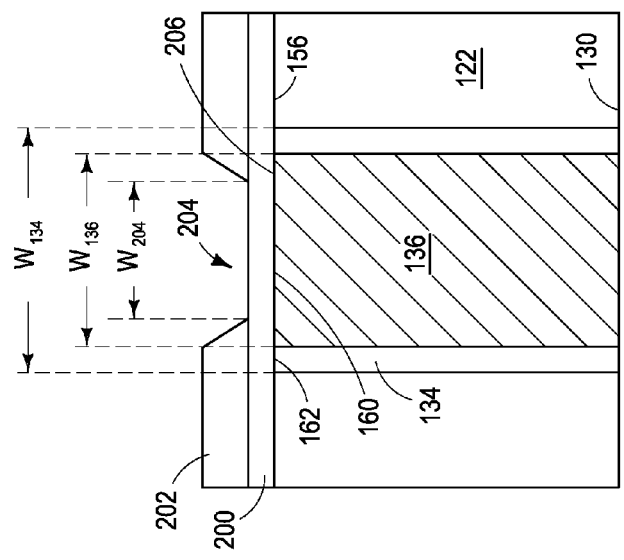

FIG. 4e shows the structure of FIG. 4d in greater detail. Openings 204 extend through insulating layer 202 to insulating layer 200. Openings 204 in insulating layer 202 expose a portion of insulating layer 200. Openings 204 in insulating layer 202 are formed over conductive vias 136, while a portion of insulating layer 202 remains over portion 206 of conductive vias 136. The sidewalls of openings 204 can have a tapered, straight, or stepped profile. In one embodiment, insulating layer 202 overlies surface 162 of insulating layer 134 and a portion 206 of conductive vias 136. A cross-sectional width $W_{204}$ of openings 204 is less than a width $W_{136}$ of conductive vias 136. In another embodiment, openings 204 include a cross-sectional width $W_{204}$ greater than a width $W_{136}$ of conductive vias 136 or greater than a width $W_{134}$ of insulating layer 134 together with conductive vias 136.

In FIG. 4f, a portion of insulating layer 200 is removed by an etching process through insulating layer 202 to form openings 208 and expose conductive vias 136. Insulating layer 202 operates as a masking layer for the etching of insulating layer 200. In another embodiment, an additional photoresist layer is formed over insulating layer 202 and is used as a masking layer in the etching process. In yet another embodiment, openings 208 are formed by LDA to remove a portion of insulating layer 200 and to expose conductive vias 136. A first portion of insulating layer 200 is removed from over conductive vias 136 while leaving a second portion of insulating layer 200 covering conductive vias 136.

FIG. 4g shows the structure of FIG. 4f in greater detail. Openings 208 extend through insulating layer 202 and insulating layer 200. Openings 208 in insulating layers 200 and 202 are formed to expose a portion of surface 160 of conductive vias 136, while a portion 206 of conductive vias 136 remains covered by insulating layers 200 and 202. In one embodiment, insulating layer 200 overlies surface 162 of insulating layer 134 and a portion 206 of conductive vias 136. A cross-sectional width $W_{208}$ of openings 208 is less than a width $W_{136}$ of conductive vias 136. Insulating layer 200 covers coplanar surface 156 of base substrate material 122 and surface 162 of insulating layer 134. In another embodiment, openings 208 include a cross-sectional width $W_{208}$ greater than a width $W_{136}$ of conductive vias 136 or greater than a width $W_{134}$ of insulating layer 134 together with conductive vias 136.

Figure 4H:
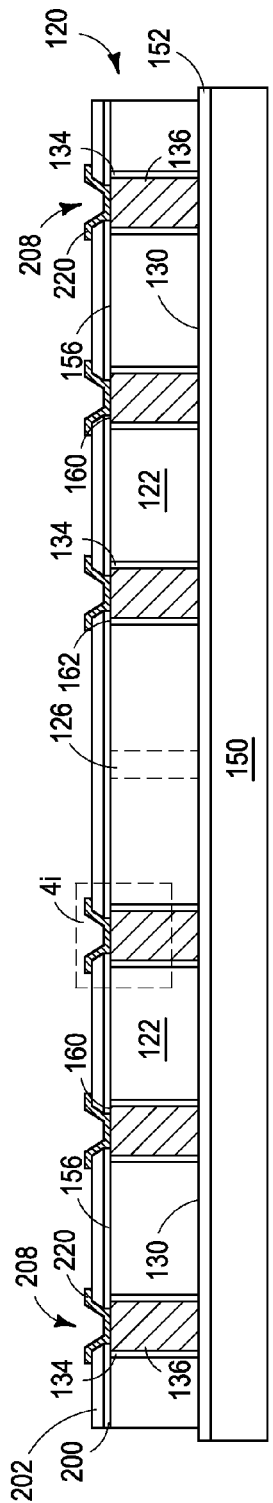

In FIG. 4h, an electrically conductive layer 220 is formed over insulating layers 200 and 202 and over conductive vias 136 using printing, PVD, CVD, sputtering, evaporation, electrolytic plating, electroless plating, or other suitable metal deposition process. Conductive layer 220 can be one or more layers of Al, Cu, Sn, Ni, Au, Ag, Ti, W, TiW, TiCu, TiWCu, TaNCu, or other suitable material. Conductive layer 220 directly contacts the exposed portion, surface 160, of conductive vias 136. Conductive layer 220 operates as a UBM electrically connected to conductive vias 136. UBM 220 can be a multi-metal stack with adhesion layer, barrier layer, and seed or wetting layer. The adhesion layer is formed over conductive vias 136 and can be Ti, TiN, TiW, Al, or Cr. The barrier layer is formed over the adhesion layer and can be Ni, TaN, NiV, Pt, Pd, TiW, Ti, CrCu, or other suitable barrier material. The barrier layer inhibits the diffusion of Cu into the active area of the die. The seed layer is formed over the barrier layer and can be Cu, Ni, NiV, Au, or Al. UBM 220 provides a low resistive interconnect to conductive vias 136, as well as a barrier to solder diffusion and seed layer for solder wettability.

Figure 4I:
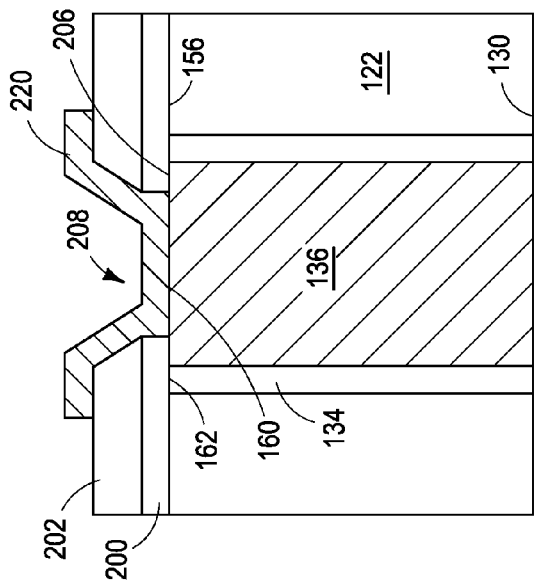

FIG. 4i shows the structure of FIG. 4h in greater detail. Conductive layer 220 is formed within openings 208 in insulating layer 200, over sidewalls of insulating layers 200 and 202, and over insulating layer 202. In one embodiment, conductive layer 220 is formed over the entire surface 156 of semiconductor wafer 120, and portions of conductive layer 220 are subsequently removed by etching or other suitable process.

Figure 4J:
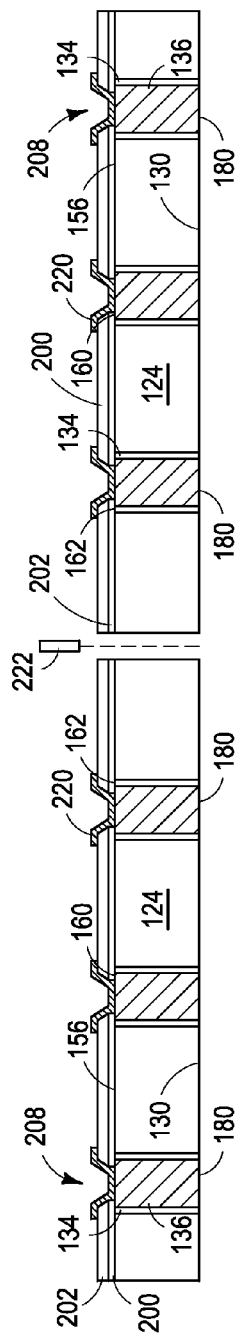

In FIG. 4j carrier 150 and interface layer 152 are removed by chemical etching, mechanical peeling, CMP, mechanical grinding, thermal bake, UV light, laser scanning, or wet stripping to expose active surface 130 of semiconductor wafer 120. After carrier 150 and interface layer 152 are removed, active surface 130 of semiconductor die 124 and surface 180 of conductive vias 136 are exposed.

Semiconductor wafer 120 is singulated through saw street 126 using a saw blade or laser cutting tool 222 into individual semiconductor die 124. The individual semiconductor die 124 can be inspected and electrically tested for identification of KGD post singulation.

Figure 4K:
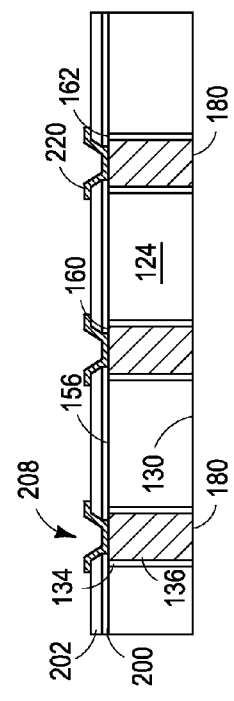

FIG. 4k shows semiconductor die 124 after singulation. Semiconductor die 124 includes conductive vias 136 extending completely through semiconductor die 124 from active surface 130 to surface 156. Conductive vias 136 are surrounded by insulating layer 134 formed over a sidewall of conductive vias 136. Surface 180 of conductive vias 136 is exposed at active surface 130 of semiconductor die 124. Conductive layer 220 is electrically connected to conductive vias 136. Conductive vias 136 route electrical signals through semiconductor die 124. Conductive vias 136 provide vertical electrical interconnection from active surface 130 of semiconductor die 124 to external devices, for example a PCB. Semiconductor die 124 can be further processed into many types of semiconductor packages, including eWLB, WLCSP, eWLCSP, fan-out WLCSP, flip-chip packages, 3D packages, PoP, or other semiconductor packages.

The process for revealing conductive vias 136 uses fewer steps than current via reveal processes. In particular, the process of forming and revealing conductive vias 136 is accomplished with fewer CMP and etching steps. For example, one CMP step is used during the wafer-thinning step of FIG. 3b, while a second CMP step is eliminated through the process shown in FIGS. 4a-3j. Additionally, the step of etching semiconductor wafer 120 to form a recess in the wafer is eliminated. Therefore, semiconductor die 124 can be produced more cost-effectively without the expensive processes of silicon etching and additional CMP steps. Elimination of etching and CMP steps reduces the cost of manufacturing semiconductor die 124 including conductive vias 136. Additionally, the use of an organic insulating material reduces the residual stress on the inorganic insulating material and reduces the overall stress on the semiconductor device.

Figure 4L:
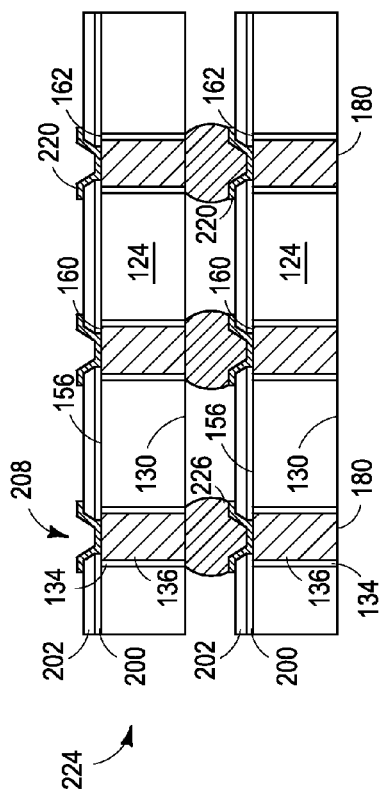

FIG. 4l shows semiconductor package 224 formed by stacking two or more semiconductor die 124. An electrically conductive bump material is deposited over conductive layer 220 or conductive vias 136 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 220 using a suitable attachment or bonding process. In one embodiment, the bump material is reflowed by heating the material above its melting point to form balls or bumps 226. In some applications, bumps 226 are reflowed a second time to improve electrical contact to conductive layer 220 or conductive vias 136. In one embodiment, bumps 226 are formed over a UBM layer. Bumps 226 can also be compression bonded or thermocompression bonded to conductive layer 220 or conductive vias 136. Bumps 226 represent one type of interconnect structure that can be formed over conductive layer 220 or conductive vias 136. The interconnect structure can also use bond wires, conductive paste, stud bump, micro bump, or other electrical interconnect.

The stacked semiconductor die 124 in semiconductor package 224 are electrically connected through bumps 226. Additional interconnect structures, similar to bumps 226, are formed over conductive vias 136 and conductive layer 220 to provide electrical interconnect to external devices. The circuits on active surface 130 of a first semiconductor die 124 are electrically connected through conductive vias 136 and bumps 226 to the circuits on active surface 130 of a second semiconductor die 124.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor device, comprising:
    providing a semiconductor wafer including a plurality of semiconductor die;
    forming a plurality of conductive vias extending into a first surface of the semiconductor wafer and only partially through the semiconductor wafer including a conductive via in each of the plurality of semiconductor die;

planarizing the semiconductor wafer to leave a second surface of the semiconductor wafer coplanar with surfaces of the plurality of conductive vias;

forming a first insulating layer on the second surface of the semiconductor wafer to cover the surfaces of the plurality of conductive vias;

forming a second insulating layer over the first insulating layer;

forming a plurality of openings in the second insulating layer over the plurality of conductive vias;

etching the first insulating layer using the second insulating layer as a mask to extend the plurality of openings through the first insulating layer and expose the plurality of conductive vias, wherein each of the plurality of openings through the first insulating layer and second insulating layer includes a footprint smaller than a footprint of an underlying conductive via;

forming an under-bump metallization (UBM) layer over the second insulating layer outside the plurality of openings and contacting the plurality of conductive vias through the plurality of openings; and forming a plurality of conductive bumps over the UBM layer, wherein each of the conductive bumps extends into one of the plurality of openings.

2. The method of claim 1, wherein planarizing the semiconductor wafer is by chemical mechanical polishing.

3. The method of claim 1, wherein forming the conductive via further includes:
forming a via in the semiconductor wafer; and
depositing a conductive material within the via.

4. The method of claim 1, further including:
singulating the semiconductor wafer to separate the plurality of semiconductor die; and
stacking a first semiconductor die from the semiconductor wafer over a second semiconductor die from the semiconductor wafer with the conductive via of the first semiconductor die aligned to the conductive via of the second semiconductor die.

5. The method of claim 4, wherein one of the plurality of conductive bumps extends from the UBM on the second semiconductor die to the conductive via of the first semiconductor die.

6. A method of making a semiconductor device, comprising:
providing a semiconductor wafer including a first semiconductor die and a second semiconductor die;
forming a first conductive via through the first semiconductor die and a second conductive via through the second semiconductor die with a surface of the first conductive via, a surface of the second conductive via, and a surface of the semiconductor wafer being coplanar;
forming a first insulating layer over the surface of the first conductive via, the surface of the second conductive via, and the surface of the semiconductor wafer;
forming a second insulating layer over the first insulating layer;
forming a first opening in the second insulating layer aligned with the first conductive via and a second opening in the second insulating layer aligned with the second conductive via;
etching the first insulating layer using the second insulating layer as a mask, wherein the first insulating layer and second insulating layer remain extending over the first conductive via and second conductive via after etching the first insulating layer; and
forming a conductive layer over the second insulating layer and contacting the first conductive via and the second conductive via.

7. The method of claim 6, further including forming the first opening and second opening in the second insulating layer using a photolithography process.

8. The method of claim 6, further including singulating the semiconductor wafer to physically separate the first semiconductor die and second semiconductor die.

9. The method of claim 8, further including stacking the first semiconductor die over the second semiconductor die with the first conductive via aligned to the second conductive via.

10. The method of claim 9, further including providing a conductive bump between the first conductive via and second conductive via.

11. The method of claim 10, wherein the conductive bump extends from the conductive layer within the second opening to the first conductive via.

12. A method of making a semiconductor device, comprising:
providing a semiconductor wafer;
forming a first conductive via partially through the semiconductor wafer;
removing a portion of the semiconductor wafer and first conductive via to planarize the semiconductor wafer and first conductive via;
forming a first insulating layer over the first conductive via and the semiconductor wafer while the first conductive via and semiconductor wafer remain coplanar;
forming a second insulating layer over the first conductive via, the first insulating layer, and the semiconductor wafer;
forming an opening through the first insulating layer and second insulating layer over the first conductive via, wherein forming the opening through the first insulating layer and second insulating layer leaves a portion of the first insulating layer and a portion of the second insulating layer remaining over the first conductive via; and
forming a conductive layer over the second insulating layer and extending into the opening to contact the first conductive via.

13. The method of claim 12, wherein the first insulating layer includes an inorganic material and the second insulating layer includes an organic material.

14. The method of claim 12, wherein forming the opening through the first insulating layer and second insulating layer includes:
removing a portion of the second insulating layer to expose the first insulating layer; and
etching the first insulating layer using the second insulating layer as a mask.

15. The method of claim 12, further including disposing a conductive bump on the conductive layer within the opening.

16. The method of claim 15, further including:
providing a semiconductor die comprising a second conductive via extending through the semiconductor die; and
disposing the semiconductor die over the first conductive via with the conductive bump contacting the second conductive via.

17. A method of making a semiconductor device, comprising:

providing a semiconductor wafer;
forming a conductive via through the semiconductor wafer;
forming a first insulating layer over the conductive via and semiconductor wafer;
forming a second insulating layer over the first insulating layer;
forming an opening in the second insulating layer over the conductive via while leaving a portion of the second insulating layer overlapping the conductive via;
etching the first insulating layer through the opening to expose the conductive via; and
forming a conductive layer over the second insulating layer and electrically coupled to the conductive via.

18. The method of claim 17, wherein the first insulating layer includes an inorganic material and the second insulating layer includes an organic material.

19. The method of claim 17, wherein a surface of the conductive via is coplanar with a surface of the semiconductor wafer while forming the first insulating layer.

20. The method of claim 17, further including etching the first insulating layer using the second insulating layer as a mask.

21. The method of claim 17, further including forming the conductive layer on the second insulating layer outside the opening and extending into the opening to contact the conductive via.

22. The method of claim 17, further including disposing a conductive bump over the conductive layer and extending into the opening.

* * * * *